US012802773B2

(12) United States Patent
Kim et al.

(10) Patent No.: US 12,802,773 B2
(45) Date of Patent: Nov. 17, 2026

(54) MEMORY DEVICE INCLUDING REPAIR MEMORY CELL AND REPAIR METHOD THEREOF

(71) Applicant: Samsung Electronics Co., Ltd., Suwon-si (KR)

(72) Inventors: Taeyun Kim, Suwon-si (KR); Sanghee Kang, Suwon-si (KR); Jeongkyu Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 35 days.

(21) Appl. No.: 18/805,853

(22) Filed: Aug. 15, 2024

(65) Prior Publication Data

US 2025/0226047 A1 Jul. 10, 2025

(30) Foreign Application Priority Data

Jan. 9, 2024 (KR) ........................ 10-2024-0003581

(51) Int. Cl.
*G11C 29/44* (2006.01)

(52) U.S. Cl.
CPC ................................ *G11C 29/4401* (2013.01)

(58) Field of Classification Search
None
See application file for complete search history.

(56) References Cited

U.S. PATENT DOCUMENTS 6,704,226 B2 * 3/2004 Lee ...................... G11C 29/785 365/201
7,093,171 B2 * 8/2006 Hsu ...................... G11C 29/808 714/711
7,376,025 B2 5/2008 Merritt et al.
8,693,270 B2 4/2014 Won
9,583,215 B2 2/2017 Jeong et al.
9,767,922 B2 9/2017 Lee et al.
9,831,003 B2 11/2017 Sohn et al.
11,301,317 B2 4/2022 Kim et al.
11,527,303 B2 12/2022 Ryu et al.

FOREIGN PATENT DOCUMENTS

KR 10-2017-0055222 A 5/2017
KR 10-2127455 B1 6/2020
KR 10-2021-0011610 A 2/2021
KR 10-2021-0050213 A 5/2021

* cited by examiner

*Primary Examiner* — Guerrier Merant
(74) *Attorney, Agent, or Firm* — Muir Patent Law, PLLC

(57) ABSTRACT

A memory device including a first memory bank including first memory cells connected to a first wordline, a second memory bank including second memory cells connected to a second wordline corresponding to the first wordline, and a repair circuit configured to repair the first wordline and the second wordline together or configured to repair the first wordline or the second wordline individually based on positions of failed memory cells included in the first memory cells and the second memory cells.

19 Claims, 17 Drawing Sheets

1000

MEMORY DEVICE INCLUDING REPAIR MEMORY CELL AND REPAIR METHOD THEREOF

CROSS-REFERENCE TO RELATED APPLICATIONS

This application claims priority under 35 U.S.C. § 119 to Korean Patent Application No. 10-2024-0003581 filed on Jan. 9, 2024, in the Korean Intellectual Property Office, the disclosure of which is incorporated by reference herein in its entirety.

BACKGROUND

1. Field

Example embodiments of the present disclosure described herein relate to a semiconductor memory device, and more particularly, relate to a memory device including a repair memory cell and a repair method thereof.

2. Description of Related Art

A semiconductor memory may be mainly classified as a volatile memory or a non-volatile memory. Read and write speeds of the volatile memory (for example, a DRAM or an SRAM) are fast, but the data stored in the volatile memory disappear when a power is turned off. In contrast, the non-volatile memory may retain data even when the power is turned off. Therefore, the non-volatile memory may be used to store contents that must be preserved regardless of whether power is supplied or not.

A representative example of a volatile memory device is a DRAM. A memory cell of a volatile memory device may include a single N-type transistor, serving as a switch, and a single capacitor storing electric charges (data). Binary information "1" or "0" may correspond to the presence or absence of the electric charges stored in the capacitor in the memory cell, for example, whether a terminal voltage of a cell capacitor is high or low. The memory cell may be connected to a wordline and a bitline. The bitline may be connected to a sense amplifier. The sense amplifier may sense data, stored in the memory cell, through the bitline based on a voltage applied to the wordline.

The volatile memory device may include failed (i.e., faulty) memory cells during a manufacturing process. The failed memory cells may reduce the reliability of the volatile memory device. To ensure the reliability of the volatile memory device, the volatile memory device may include additional redundancy memory cells to replace the failed memory cells. However, a method is needed to effectively repair the failed memory cells with limited redundancy memory cells.

SUMMARY

Example embodiments of the present disclosure provide a memory device changing a repair mode of memory banks based on distribution of failed memory cells.

According to an embodiment, a memory device including: a first memory bank including first memory cells connected to a first wordline; a second memory bank including second memory cells connected to a second wordline corresponding to the first wordline; and a repair circuit configured to repair the first wordline and the second wordline together or configured to repair the first wordline or the second wordline individually based on positions of failed memory cells included in the first memory cells and the second memory cells.

According to an embodiment, a memory device including: a first memory bank including a first wordline group; a second memory bank including a second wordline group corresponding to the first wordline group; a row decoder configured to select wordlines of the first memory bank and the second memory bank based on an address received from an external device; and a repair circuit configured to provide a spare wordline driving signal to the row decoder so that bank repair mode information corresponding to the first wordline group or the second wordline group is checked when the first wordline group or the second wordline group is selected based on the address, and the first wordline group and the second wordline group are repaired together, or the first wordline group or the second wordline group are repaired individually based on the bank repair mode information.

According to an embodiment, a repair method of a memory device including: comparing an address received from an external device and bank repair mode information for determining a repair mode for each of memory banks included in the memory device; determining a repair mode of the first memory bank corresponding to the address based on the comparison result; repairing, in a first repair operation, a failed wordline included in the first memory bank and a wordline corresponding to the failed wordline in a second memory bank together when the repair mode is determined to be a first repair mode; and individually repairing, in a second repair operation, the failed wordline included in the first memory bank and a failed wordline included in the second memory bank when the repair mode is determined to be a second repair mode.

BRIEF DESCRIPTION OF THE FIGURES

The above and other objects and features of the present disclosure will become apparent by describing in detail embodiments thereof with reference to the accompanying drawings.

DETAILED DESCRIPTION

Below, example embodiments of the present disclosure will be described in detail and clarity to such an extent that one of ordinary skill in the art may easily implement the inventive concepts.

Below, a DRAM will be used as an example for illustrating features and functions of the present disclosure. However, other features and performances may be easily understood from information disclosed herein by a person of ordinary skill in the art. The present disclosure may be implemented by other embodiments or applied thereto. Further, the detailed description may be modified or changed according to viewpoints and applications without escaping from the scope, spirit, and other objects of the present disclosure.

Figure 1:
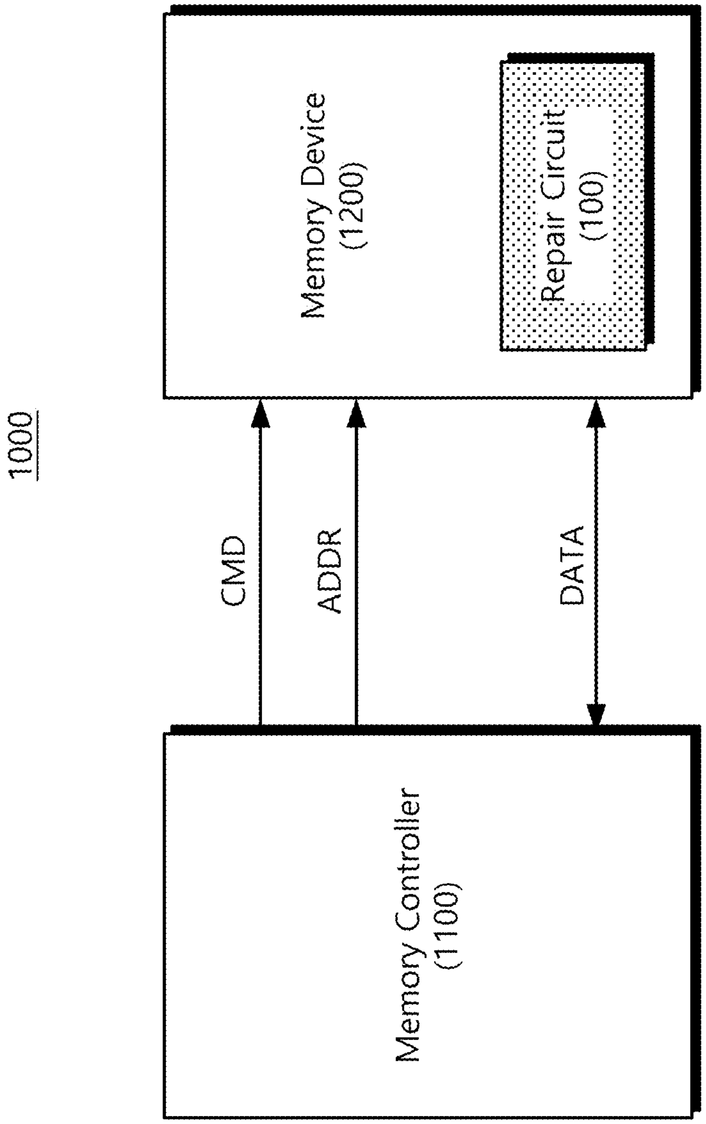
FIG. 1 is a block diagram illustrating a memory system according to an example embodiment.

FIG. 1 is a block diagram illustrating a memory system according to an example embodiment. Referring to FIG. 1, a memory system 1000 may include a memory controller 1100 and a memory device 1200.

According to an example embodiment, the memory controller 1100 may perform an access operation of writing data to the memory device 1200 or reading data stored in the memory device 1200. For example, the memory controller 1100 may generate a command CMD and an address ADDR for writing data to the memory device 1200 or reading data stored in the memory device 1200. The memory controller 1100 may include at least one of a control circuit controlling the memory device 1200, a system-on-chip (SoC) such as an application processor (AP), a central processing unit (CPU), a digital signal processor (DSP), and a graphics processing unit (GPU).

According to an example embodiment, the memory controller 1100 may provide various signals to the memory device 1200 to control an overall operation of the memory device 1200. For example, the memory controller 1100 may control memory access operations of the memory device 1200 such as a read operation and a write operation. The memory controller 1100 may provide the command CMD and the address ADDR to the memory device 1200 to write data DATA in the memory device 1200 or to read data DATA from the memory device 1200.

According to an example embodiment, the memory controller 1100 may generate various types of commands CMD to control the memory device 1200. For example, the memory controller 1100 may generate a bank request corresponding to a bank operation of changing a state of a memory bank, among memory banks, to read or write data DATA.

As an example, the bank request may include an active request for changing a state of a memory bank, among the memory banks, to an active state. The memory device 1200 may activate a row included in the memory bank, for example, a wordline, in response to the active request. The bank request may include a precharge request for changing the memory banks from an active state to a standby state after reading or writing of data DATA is completed.

In addition, the memory controller 1100 may generate an input/output (I/O) request (for example, a column address strobe (CAS) request) for the memory device 1200 to perform a read operation or a write operation of data DATA. As an example, the I/O request may include a read request for reading data DATA from activated memory banks. The I/O request may include a write request for writing data DATA in the activated memory banks.

Furthermore, the memory controller 1100 may generate a refresh command to control a refresh operation on the memory banks. However, the types of commands CMD described herein are merely exemplary, and other types of commands CMD may be present.

According to an example embodiment, the memory device 1200 may output data DATA, requested to be read by the memory controller 1100, to the memory controller 1100 or may store data DATA, requested to be written by the memory controller 1100, in a memory cell of the memory device 1200. The memory device 1200 may input and output data DATA based on the command CMD and the address ADDR. The memory device 1200 may include memory banks.

The memory device 1200 may be a volatile memory device such as a dynamic random access memory (DRAM), a synchronous dynamic random access memory (SDRAM), a double data rate (DDR) DRAM, a DDR SDRAM, a low-power double data rate (LPDDR) SDRAM, a graphics double data rate (GDDR) SDRAM, a Rambus dynamic random access memory (RDRAM), and a static random access memory (SRAM), or the like. Alternatively, the memory device 1200 may be implemented as a nonvolatile memory device such as a resistive RAM (RRAM), a phase change memory (PRAM), a magnetoresistive memory (MRAM), a ferroelectric memory (FRAM), a spin-transfer torque RAM (STT-RAM), or the like. In the present specification, the advantages of the present disclosure have been described with respect to a DRAM, but example embodiments are not limited thereto.

According to an example embodiment, the memory banks may include a memory cell array divided in units of banks, a row decoder, a column decoder, a sense amplifier, a write driver, or the like. The memory banks may store data DATA, requested to be written in the memory device 1200, through the write driver and may read data DATA, requested to be read, using the sense amplifier. The memory banks may further include a component for a refresh operation of storing and maintaining data in the cell array, or select circuits based on an address.

According to an example embodiment, the memory device 1200 may include a repair circuit 100. For example, the memory device 1200 may include failed (i.e., faulty) memory cells. The memory device 1200 may replace a wordline including at least one failed memory cell (hereinafter referred to as a failed wordline) with a redundancy wordline.

According to an example embodiment, when repairing a failed wordline, the repair circuit 100 may determine a repair mode. For example, the memory device 1200 may repair a failed wordline according to a first repair mode in which wordlines included in two memory banks and corresponding to each other are repaired together or a second repair mode in which each of the two memory banks is individually repaired. The repair circuit 100 may determine the repair mode of the selected wordline based on an address of the selected wordline.

Figure 2:
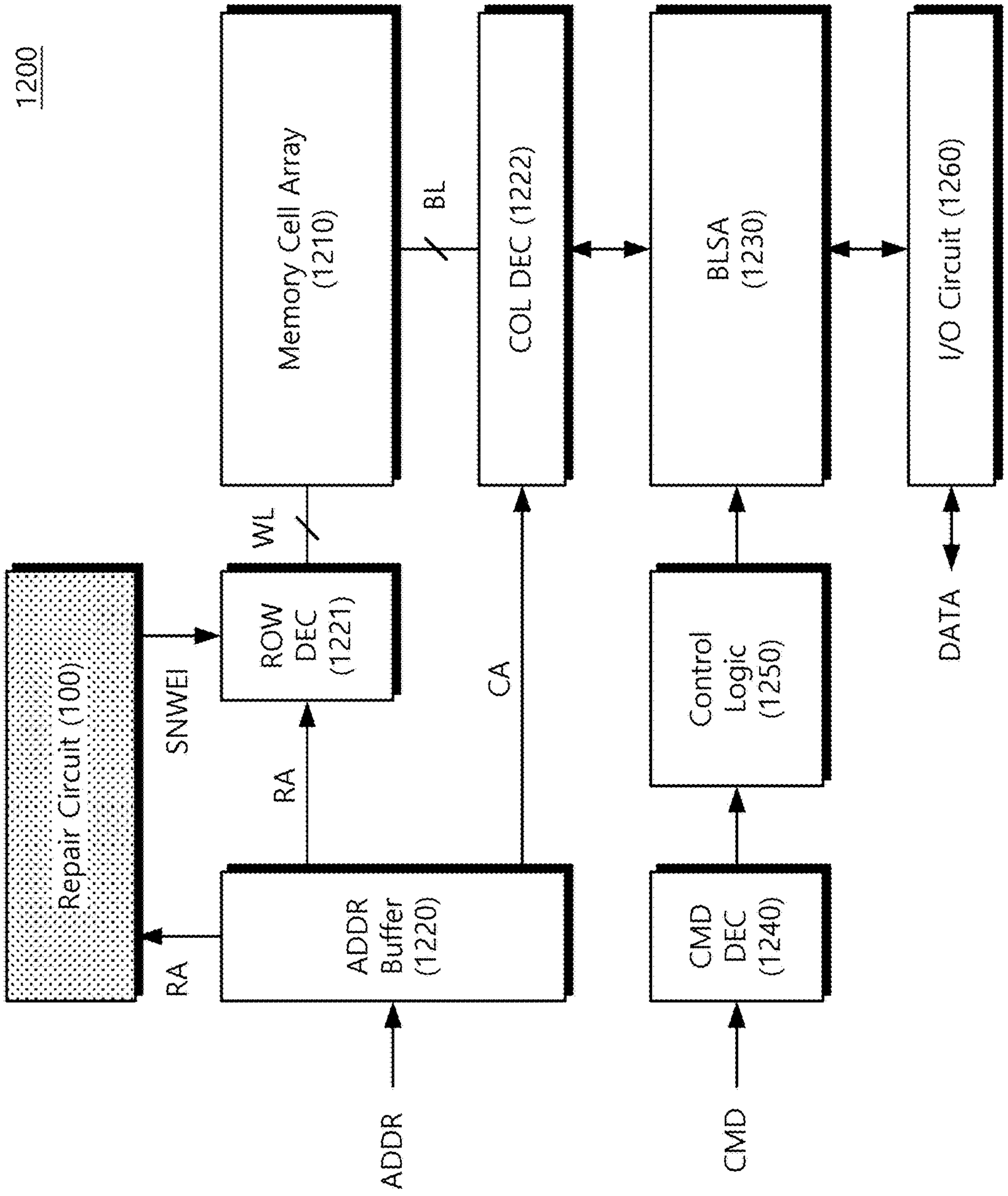
FIG. 2 is a block diagram illustrating a memory device of FIG. 1.

FIG. 2 is a block diagram illustrating a memory device of FIG. 1. Referring to FIG. 2, the memory device 1200 may include a memory cell array 1210, an address buffer 1220, a row decoder 1221, a column decoder 1222, a bitline sense amplifier 1230, a command decoder 1240, control logic 1250 and an input/output circuit 1260. In addition, the memory device 1200 may include a repair circuit 100.

According to an example embodiment, the memory cell array 1210 may include a plurality of memory cells arranged in a matrix of rows and columns. For example, the memory cell array 1210 may include a plurality of wordlines WL and a plurality of bitlines BL connected to memory cells. The plurality of wordlines WL may be connected to rows of the memory cells, and the plurality of bitlines BL may be connected to columns of the memory cells.

According to an example embodiment, the address buffer 1220 may receive an address ADDR from the memory controller 1100 of FIG. 1. For example, the address ADDR may include a row address RA addressing a row of the memory cell array 1210 and a column address CA addressing a column of the memory cell array 1210. The address buffer 1220 may transmit the row address RA to the row decoder 1221 and may transmit the column address CA to the column decoder 1222.

According to an example embodiment, the row decoder 1221 may select one of the plurality of wordlines WL connected to the memory cell array 1210. The row decoder 1221 may decode the row address RA, received from the address buffer 1220, to select a single wordline corresponding to the row address RA and may activate the selected wordline.

According to an example embodiment, the column decoder 1222 may select a predetermined bitline from among the plurality of bitlines BL of the memory cell array 1210. The column decoder 1222 may decode the column address CA, received from the address buffer 1220, to select the predetermined bitline BL corresponding to the column address CA.

According to an example embodiment, the bitline sense amplifier 1230 may be connected to the bitlines BL of the memory cell array 1210. For example, the bitline sense amplifier 1230 may sense a change in voltage of a selected bitline, among the plurality of bitlines BL, and may amplify and output the change in voltage.

According to an example embodiment, the command decoder 1240 may decode a write enable signal/WE, a row address strobe signal/RAS, a column address strobe signal/CAS, and a chip select signal/CS received from the memory controller 1100 such that control signals corresponding to the command CMD are generated in the control logic 1250. The command CMD may include an active request, a read request, a write request, or a precharge request.

The control logic 1250 may control an overall operation of the bitline sense amplifier 1230 through the control signals corresponding to the command CMD. The control logic 1250 may generate control signals such that the bitline sense amplifier 1230 operates as a single-ended sense amplifier. Additionally, the control logic 1250 may control an overall operation of the memory device 1200.

According to an example embodiment, the input/output circuit 1260 may output data DATA to the memory controller 1100 through data pad based on a sensed and amplified voltage from the bitline sense amplifier 1230. For example, the input/output circuit 1260 may include an input buffer or an output buffer. The input buffer or the output buffer may be connected to the data pad. The input/output circuit 1260 may perform a serialization operation or a deserialization operation of data DATA.

According to an example embodiment, the repair circuit 100 may repair a failed wordline with a redundancy wordline. For example, the repair circuit 100 may receive a row address RA from the address buffer 1220. The repair circuit 100 may determine whether to repair a wordline corresponding to the row address RA.

According to an example embodiment, when the wordline corresponding to the row address RA is a failed wordline, the repair circuit 100 may generate a spare wordline driving signal SNWEI based on the row address RA. The row decoder 1221 may activate a redundancy wordline (or a redundancy memory cell) corresponding to the row address RA based on the spare wordline driving signal SNWEI.

According to an example embodiment, the repair circuit 100 may store location information on failed wordlines including failed memory cells. For example, the location information of the failed wordlines may be confirmed during initial testing of the memory device 1200. The repair circuit 100 may determine a repair mode based on the location information of the failed wordlines. The memory device 1200 may perform a first repair mode and a second repair mode depending on the locations of the failed wordlines.

Figure 3:
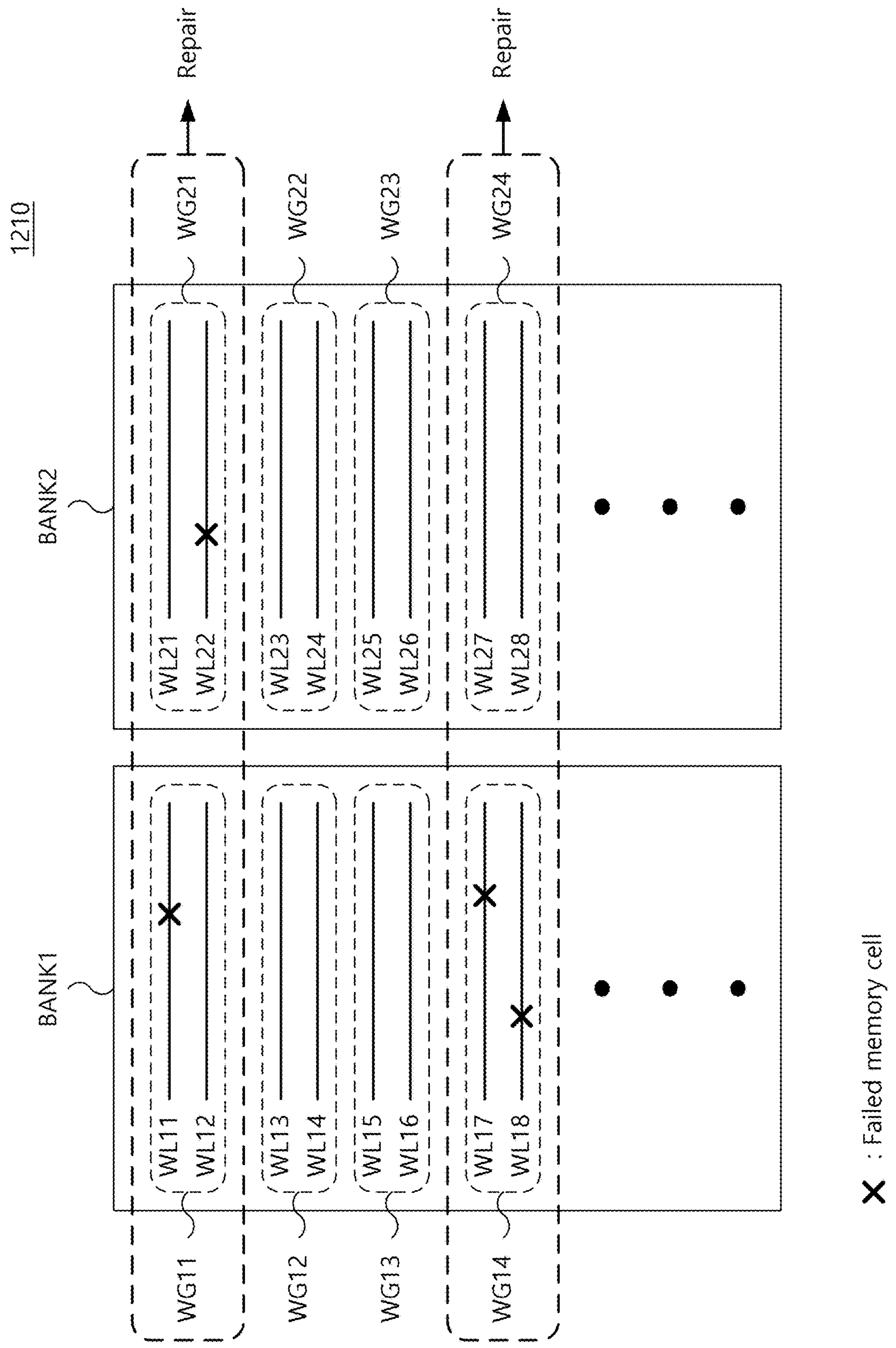
FIG. 3 is a diagram illustrating a repair operation according to a first repair mode of a memory device of FIG. 2.
Figure 4:
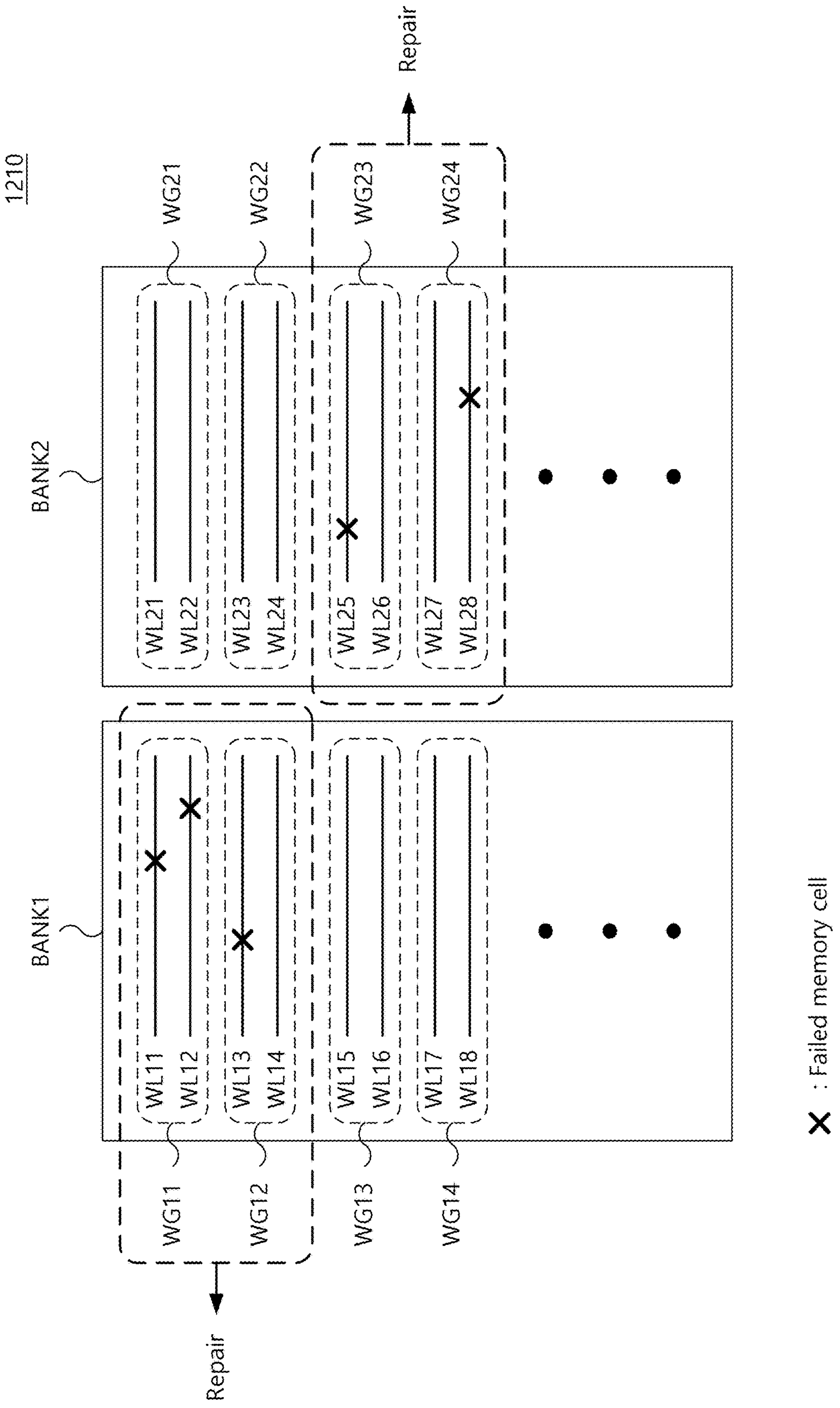
FIG. 4 is a diagram illustrating a repair operation according to a second repair mode of a memory device of FIG. 2.

FIG. 3 is a diagram illustrating a repair operation according to a first repair mode of a memory device of FIG. 2. FIG. 4 is a diagram illustrating a repair operation according to a second repair mode of a memory device of FIG. 2. Referring to FIGS. 2 to 4, the memory device 1200 may selectively perform a repair operation according to a first repair mode or a second repair mode.

According to an example embodiment, the memory cell array 1210 may include a plurality of memory banks. For example, in FIGS. 3 and 4, the memory device 1200 may perform a repair operation on a first memory bank BANK1 and a second memory bank BANK2 of the memory cell array 1210. However, this is an example, and the memory cell array 1210 may include a plurality of memory banks, and the memory device 1200 may group two memory banks among the plurality of memory banks and perform a repair operation with respect to the grouped memory banks.

According to an example embodiment, the first memory bank BANK1 may include a plurality of wordlines, and each wordline may be connected to a plurality of memory cells. The second memory bank BANK2 may include a plurality of wordlines, and each wordline may be connected to a plurality of memory cells. As an example, the first memory bank BANK1 may include an eleventh wordline WL11 to an eighteenth wordline WL18. The second memory bank BANK2 may include a twenty-first wordline WL21 to a twenty-eighth wordline WL28.

According to an example embodiment, the plurality of wordlines may be divided into a plurality of wordline groups. One wordline group may include at least one wordline.

As an example, in the first memory bank BANK1, an eleventh wordline group WG11 may include the eleventh wordline WL11 and the twelfth wordline WL12. A twelfth wordline group WG12 may include the thirteenth wordline WL13 and the fourteenth wordline WL14. A thirteenth wordline group WG13 may include the fifteenth wordline WL15 and the sixteenth wordline WL16. A fourteenth wordline group WG14 may include the seventeenth wordline WL17 and the eighteenth wordline WL18.

As an example, in the second memory bank BANK2, a twenty-first wordline group WG21 may include the twenty-first wordline WL21 and the twenty-second wordline WL22. A twenty-second wordline group WG22 may include the twenty-third wordline WL23 and the twenty-fourth wordline WL24. A twenty-third wordline group WG23 may include the twenty-fifth wordline WL25 and the twenty-sixth wordline WL26. A twenty-fourth wordline group WG24 may include the twenty-seventh wordline WL27 and the twenty-eighth wordline WL28.

According to an example embodiment, wordline groups of the first memory bank BANK1 may respectively correspond to wordline groups of the second memory bank BANK2. For example, the eleventh wordline group WG11 may correspond to the twenty-first wordline group WG21. The twelfth wordline group WG12 may correspond to the twenty-second wordline group WG22. The thirteenth wordline group WG13 may correspond to the twenty-third wordline group WG23. The fourteenth wordline group WG14 may correspond to the twenty-fourth wordline group WG24.

Referring to FIG. 3, in the first repair mode, the memory device 1200 may repair corresponding wordline groups of the first memory bank BANK1 and the second memory bank BANK2 together. For example, the memory device 1200 may repair the eleventh wordline group WG11 of the first memory bank BANK1 and the twenty-first wordline group WG21 of the second memory bank BANK2 together. The memory device 1200 may repair the fourteenth wordline group WG14 of the first memory bank BANK1 and the twenty-fourth wordline group WG24 of the second memory bank BANK2 together.

According to an example embodiment, when failed memory cells are symmetrically located in the first memory bank BANK1 and the second memory bank BANK2, the memory device 1200 may repair failed wordlines in the first repair mode. When repairing the failed wordlines in the first repair mode, the memory device 1200 may use one repair fuse to repair the eleventh wordline group WG11 of the first memory bank BANK1 and the twenty-first wordline group WG21 of the second memory bank BANK2 simultaneously. Therefore, compared to the second repair mode which may use one repair fuse to repair one memory bank, the memory device 1200 may repair twice as many failed wordlines with one repair fuse in the first repair mode. However, when failed memory cells are concentrated in one memory bank, normal (i.e., not failed or not faulty) wordlines may also be repaired in the first repair mode, which may waste repair resources.

Referring to FIG. 4, in the second repair mode, the memory device 1200 may separately repair the first memory bank BANK1 and the second memory bank BANK2. For example, the memory device 1200 may repair the eleventh wordline group WG11 and the twelfth wordline group WG12 of the first memory bank BANK1. At this time, the twenty-first wordline group WG21 and the twenty-second wordline group WG22 of the second memory bank BANK2 corresponding to the eleventh wordline group WG11 and the twelfth wordline group WG12 may not be repaired. The memory device 1200 may repair the twenty-third wordline group WG23 and the twenty-fourth wordline group WG24 of the second memory bank BANK2. At this time, the thirteenth wordline group WG13 and the fourteenth wordline group WG14 of the first memory bank BANK1 corresponding to the twenty-third wordline group WG23 and the twenty-fourth wordline group WG24 are not repaired.

According to an example embodiment, when failed memory cells are not symmetrically located in the first memory bank BANK1 and the second memory bank BANK2, the memory device 1200 may repair failed wordlines in the second repair mode. When repairing failed wordlines in the second repair mode, the memory device 1200 may repair one memory bank using one repair fuse. Accordingly, compared to the first repair mode, twice as many repair fuses may be required to repair the same number of wordline groups in the second repair mode. However, when failed memory cells are concentrated in one memory bank, the second repair mode may save repair resources compared to the first repair mode.

Figure 5:
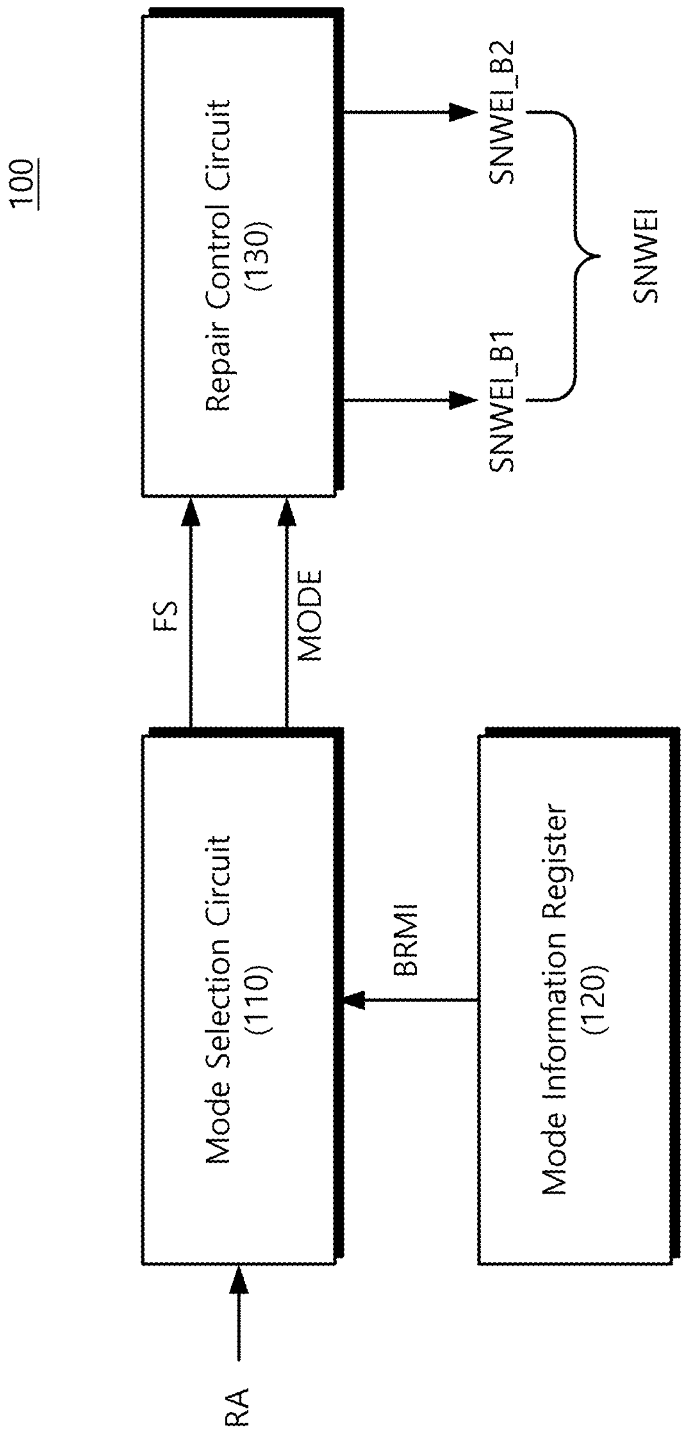
FIG. 5 is a diagram illustrating an example of a repair circuit of FIG. 2.

FIG. 5 is a diagram illustrating an example of a repair circuit of FIG. 2. Referring to FIG. 5, the repair circuit 100 may include a mode selection circuit 110, a mode information register 120, and a repair control circuit 130.

According to an example embodiment, the mode selection circuit 110 may generate a repair fuse selection signal FS and a repair mode signal MODE based on the row address RA. For example, the mode selection circuit 110 may receive bank repair mode information BRMI from the mode information register 120. The bank repair mode information BRMI may include information indicating a repair mode of each memory bank. The mode selection circuit 110 may check a repair mode of a currently activated memory bank based on the row address RA and the bank repair mode information BRMI.

According to an example embodiment, the mode information register 120 may store bank repair mode information BRMI indicating a repair mode of each memory bank. For example, the memory device 1200 may confirm locations of failed memory cells through testing before product shipment. The bank repair mode information BRMI may be generated based on the locations of failed memory cells. As an example, in two corresponding memory banks, when failed memory cells are distributed and located in corresponding wordline groups of the two memory banks, the bank repair mode information BRMI may indicate the first repair mode. In two corresponding memory banks, when failed memory cells are concentrated in one memory bank, the bank repair mode information BRMI may indicate the second repair mode.

According to an example embodiment, the repair control circuit 130 may generate the spare wordline driving signal SNWEI based on the repair fuse selection signal FS and the repair mode signal MODE. For example, the spare wordline driving signal SNWEI may include a first spare wordline driving signal SNWEI_B1 corresponding to the first memory bank BANK1 and a second spare wordline driving signal SNWEI_B2 corresponding to the second memory bank BANK2.

Figure 6:
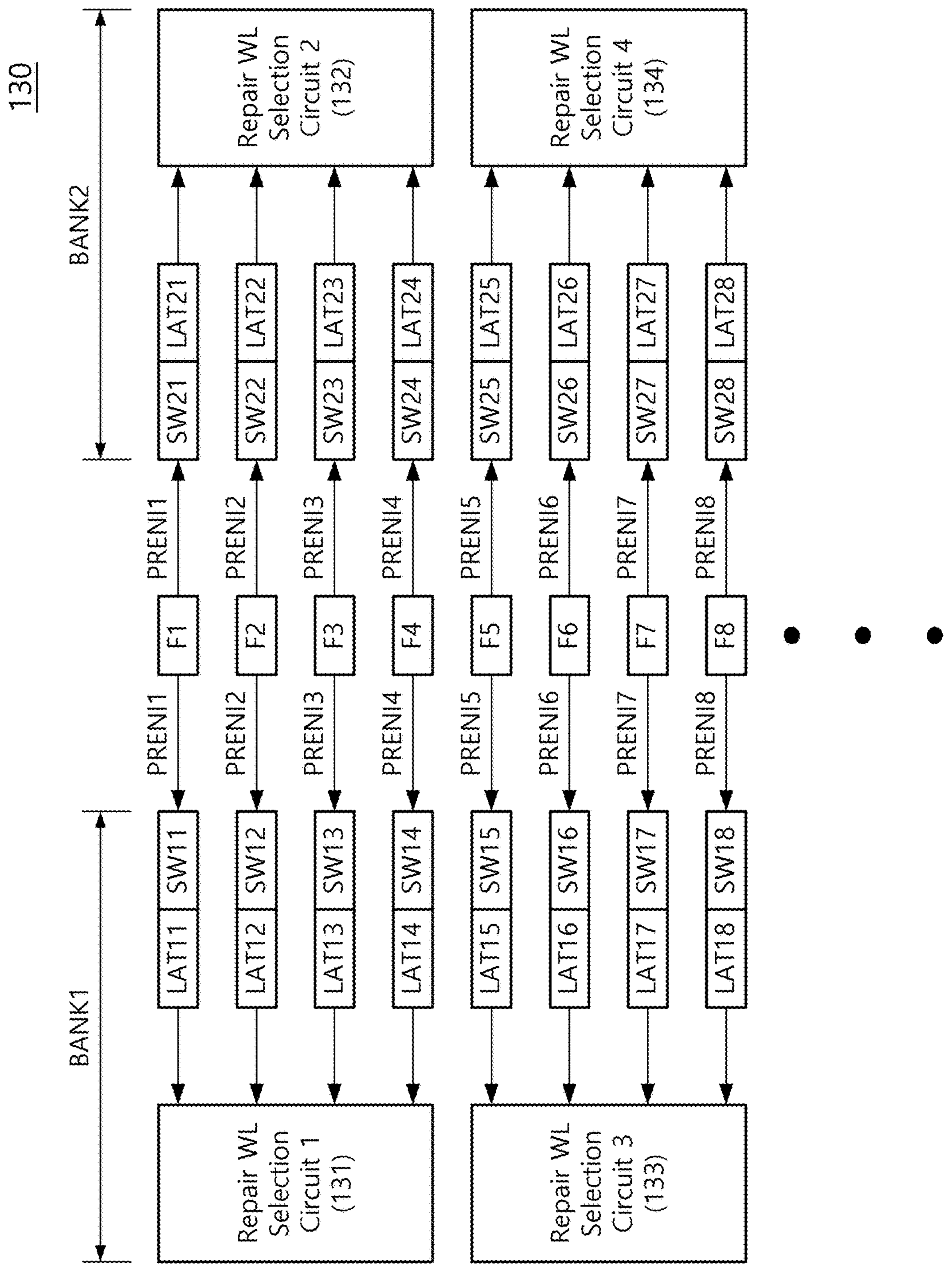
FIG. 6 is a diagram illustrating an example of a repair control circuit of FIG. 5.
Figure 7:
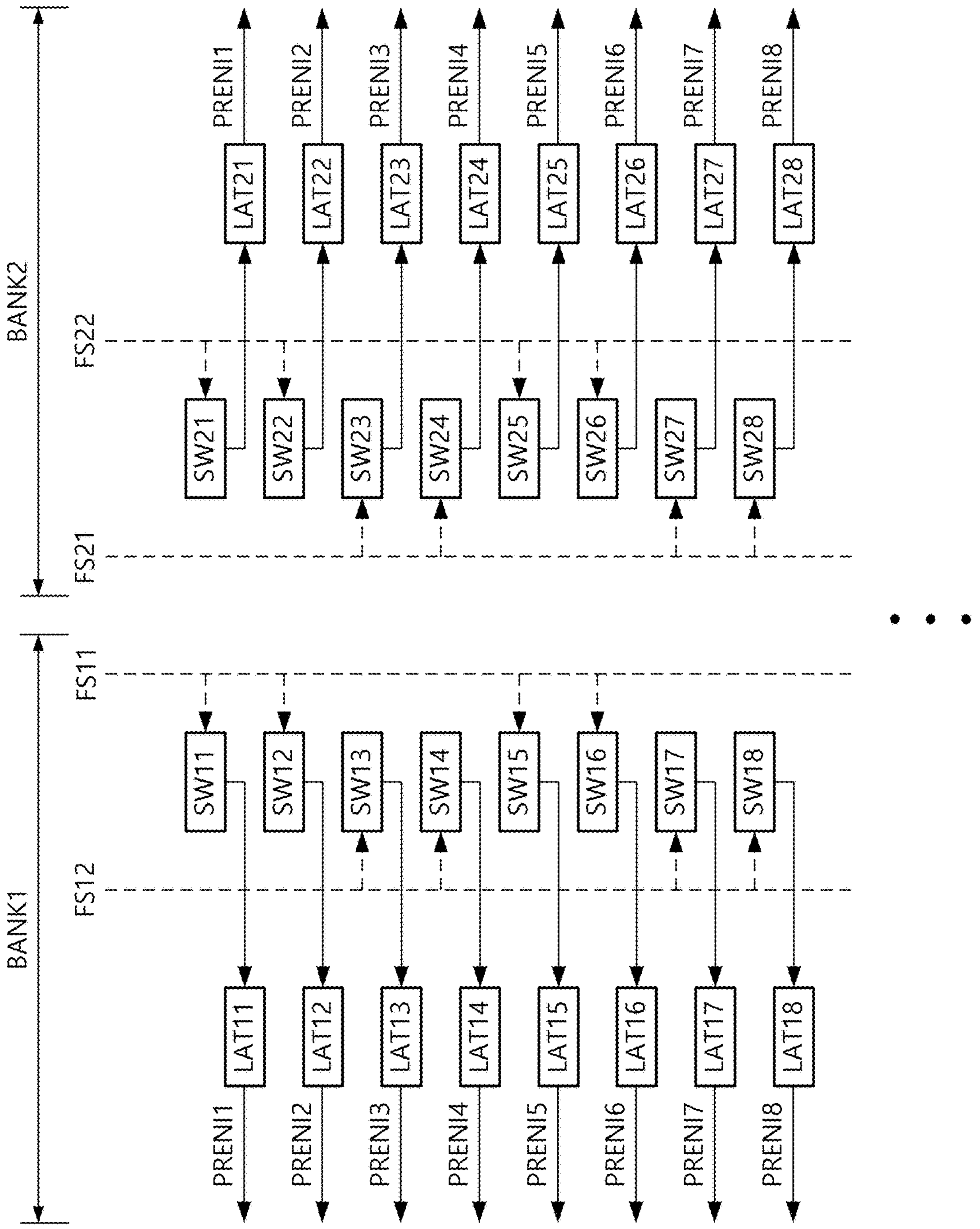
FIG. 7 is a diagram illustrating repair fuse selection signals for selecting repair fuses of FIG. 6.

FIG. 6 is a diagram illustrating an example of a repair control circuit of FIG. 5. FIG. 7 is a diagram illustrating repair fuse selection signals for selecting repair fuses of FIG. 6. Referring to FIGS. 6 and 7, the repair control circuit 130 may include a plurality of repair fuses F1 to F8. Each of the plurality of repair fuses F1 to F8 may include redundancy enable information PRENI1 to PRENI8.

According to an example embodiment, the repair control circuit 130 may include latches and switches corresponding to the first memory bank BANK1. For example, the repair control circuit 130 may include an eleventh latch LAT11 to an eighteenth latch LAT18. The repair control circuit 130 may include an eleventh switch SW11 to an eighteenth switch SW18 corresponding to the eleventh latch LAT11 to the eighteenth latch LAT18, respectively.

As an example, the first redundancy enable information PRENI1 to the fourth redundancy enable information PRENI4 output from the first repair fuse F1 to the fourth repair fuse F4 may be transmitted to a first repair wordline selection circuit 131 through the eleventh latch LAT11 to the fourteenth latch LAT14.

As an example, the fifth redundancy enable information PRENI5 to the eighth redundancy enable information PRENI8 output from the fifth repair fuse F5 to the eighth repair fuse F8 may be transmitted to a third repair wordline selection circuit 133 through the fifteenth latch LAT15 to the eighteenth latch LAT18.

According to an example embodiment, the repair control circuit 130 may include latches and switches corresponding to the second memory bank BANK2. For example, the repair control circuit 130 may include a twenty-first latch LAT21 to a twenty-eighth latch LAT28. The repair control circuit 130 may include a twenty-first switch SW21 to a twenty-eighth switch SW28 corresponding to the twenty-first latch LAT21 to the twenty-eighth latch LAT28, respectively.

As an example, the first redundancy enable information PRENI1 to the fourth redundancy enable information PRENI4 output from the first repair fuse F1 to the fourth repair fuse F4 may be transmitted to a second repair wordline selection circuit 132 through the twenty-first latch LAT21 to the twenty-fourth latch LAT24.

As an example, the fifth redundancy enable information PRENI5 to the eighth redundancy enable information PRENI8 output from the fifth repair fuse F5 to the eighth repair fuse F8 may be transmitted to a fourth repair wordline selection circuit 134 through the twenty-fifth latch LAT25 to the twenty-eighth latch LAT28.

According to an example embodiment, the redundancy enable information stored in the plurality of repair fuses F1 to F8 may be commonly used for the first memory bank BANK1 and the second memory bank BANK2. For example, the first redundancy enable information PRENI1 to the eighth redundancy enable information PRENI8 may be transmitted to the repair wordline selection circuits 131 and 133 corresponding to the first memory bank BANK1, and also, may be transmitted to the repair wordline selection circuits 132 and 134 corresponding to the second memory bank BANK2.

Referring to FIG. 7, the plurality of switches included in the repair control circuit 130 may be activated based on the repair fuse selection signal FS received from the mode selection circuit 110 of FIG. 5. For example, the eleventh switch SW11, the twelfth switch SW12, the fifteenth switch SW15 and the sixteenth switch SW16 corresponding to the first memory bank BANK1 may be turned on or turned off based on an eleventh fuse selection signal FS11. The thirteenth switch SW13, the fourteenth switch SW14, the seventeenth switch SW17 and the eighteenth switch SW18 corresponding to the first memory bank BANK1 may be turned on or turned off based on a twelfth fuse selection signal FS12.

In addition, the twenty-third switch SW23, the twenty-fourth switch SW24, the twenty-seventh switch SW27 and the twenty-eighth switch SW28 corresponding to the second memory bank BANK2 may be turned on or turned off based on a twenty-first fuse selection signal FS21. The twenty-first switch SW21, the twenty-second switch SW22, the twenty-fifth switch SW25 and the twenty-sixth switch SW26 corresponding to the second memory bank BANK2 may be turned on or turned off based on a twenty-second fuse selection signal FS22.

According to an example embodiment, in the first repair mode, the eleventh fuse selection signal FS11, the twelfth fuse selection signal FS12, the twenty-first fuse selection signal FS21 and the twenty-second fuse selection signal FS22 may be all activated. When the eleventh fuse selection signal FS11, the twelfth fuse selection signal FS12, the twenty-first fuse selection signal FS21 and the twenty-second fuse selection signal FS22 are all activated, all switches may be turned on. And the redundancy enable information PRENI may be transmitted to all of the repair wordline selection circuits 131, 132, 133, and 134 corresponding to the first memory bank BANK1 and the second memory bank BANK2. Accordingly, the first repair mode in which corresponding wordline groups of the first memory bank BANK1 and the second memory bank BANK2 are repaired together may be executed.

According to an example embodiment, in the second repair mode, the eleventh fuse selection signal FS11 and the twenty-first fuse selection signal FS21 may be activated. The twelfth fuse selection signal FS12 and the twenty-second fuse selection signal FS22 may be deactivated. Accordingly, different redundancy enable information PRENI may be transmitted to the repair wordline selection circuits 131 and 133 corresponding to the first memory bank BANK1 and the repair wordline selection circuits 132 and 134 corresponding to the second memory bank BANK2. Therefore, the second repair mode in which wordline groups that do not correspond to each other in the first memory bank BANK1 and the second memory bank BANK2 are separately repaired may be executed.

Figure 8:
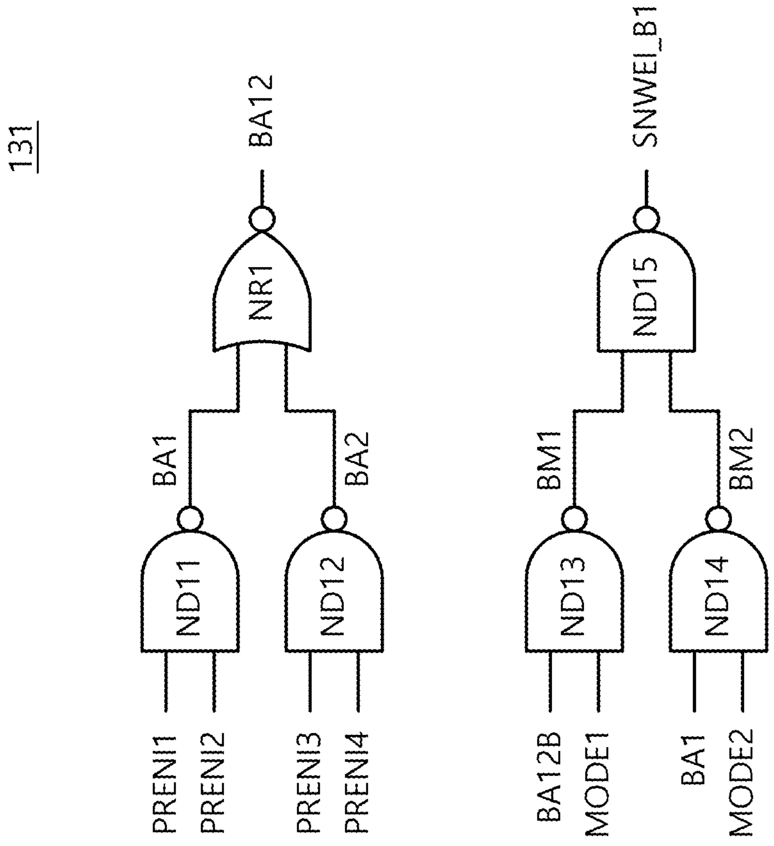
FIG. 8 is a diagram illustrating an example of a first repair wordline selection circuit of FIG. 6.

FIG. 8 is a diagram illustrating an example of a first repair wordline selection circuit of FIG. 6. FIG. 8 illustrates the first repair wordline selection circuit 131 as an example, but the remaining wordline selection circuits corresponding to the first memory bank BANK1 (for example, the third repair wordline selection circuit 133) may have the same configuration and characteristics. Referring to FIG. 8, the first repair wordline selection circuit 131 may include a plurality of logic circuits.

According to an example embodiment, the first repair wordline selection circuit 131 may include an eleventh NAND circuit ND11, a twelfth NAND circuit ND12 and a first NOR circuit NR1. For example, the eleventh NAND circuit ND11 may perform a NAND operation on the first redundancy enable information PRENI1 and the second redundancy enable information PRENI2 and output a first bank signal BA1. The twelfth NAND circuit ND12 may perform a NAND operation on the third redundancy enable information PRENI3 and the fourth redundancy enable information PRENI4 and output a second bank signal BA2. The first NOR circuit NR1 may perform a NOR operation on the first bank signal BA1 and the second bank signal BA2 and output a one-two bank signal BA12.

Additionally, the first repair wordline selection circuit 131 may include a thirteenth NAND circuit ND13, a fourteenth NAND circuit ND14 and a fifteenth NAND circuit ND15. For example, the thirteenth NAND circuit ND13 may perform a NAND operation on a complementary signal BA12B of the one-two bank signal BA12 and a first repair mode signal MODE1 and output a first repair decision signal BM1. The fourteenth NAND circuit ND14 may perform a NAND operation on the first bank signal BA1 and a second repair mode signal MODE2 and output a second repair decision signal BM2. The fifteenth NAND circuit ND15 may perform a NAND operation on the first repair decision signal BM1 and the second repair decision signal BM2 and output a first bank spare wordline driving signal SNWEI_B1.

Figure 9:
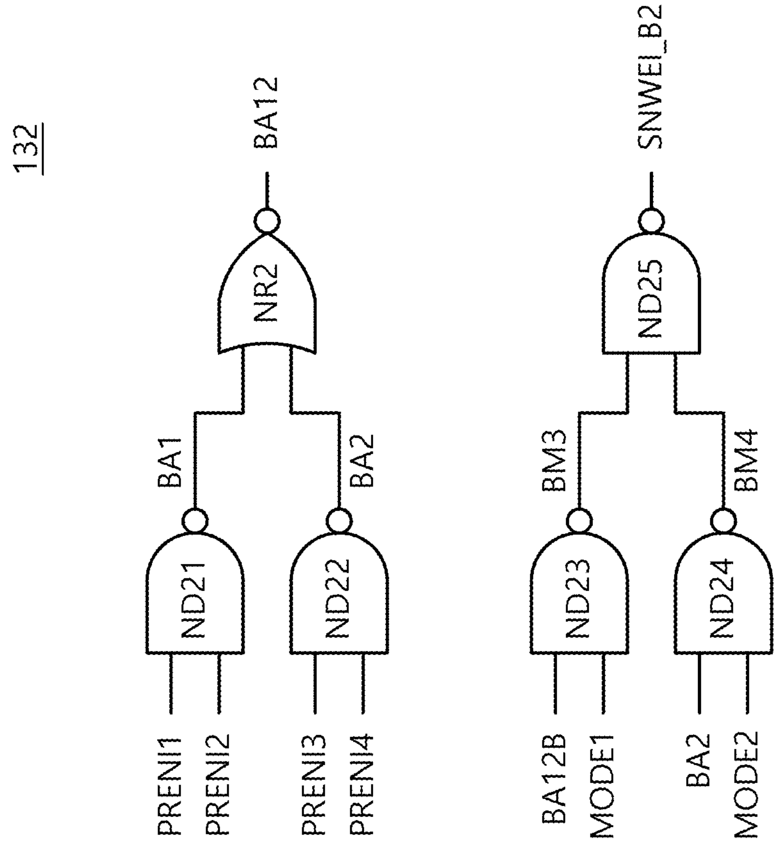
FIG. 9 is a diagram illustrating an example of a second repair wordline selection circuit of FIG. 6.

FIG. 9 is a diagram illustrating an example of a second repair wordline selection circuit of FIG. 6. FIG. 9 illustrates the second repair wordline selection circuit 132 as an example, but the remaining wordline selection circuits corresponding to the second memory bank BANK2 (for example, the fourth repair wordline selection circuit 134)

may have the same configuration and characteristics. Referring to FIG. 9, the second repair wordline selection circuit 132 may include a plurality of logic circuits.

According to an example embodiment, the second repair wordline selection circuit 132 may include a twenty-first NAND circuit ND21, a twenty-second NAND circuit ND22 and a second NOR circuit NR2. For example, the twenty-first NAND circuit ND21 may perform a NAND operation on the first redundancy enable information PRENI1 and the second redundancy enable information PRENI2 and output a first bank signal BA1. The twenty-second NAND circuit ND22 may perform a NAND operation on the third redundancy enable information PRENI3 and the fourth redundancy enable information PRENI4 and output a second bank signal BA2. The second NOR circuit NR2 may perform a NOR operation on the first bank signal BA1 and the second bank signal BA2 and output a one-two bank signal BA12.

Additionally, the second repair wordline selection circuit 132 may include a twenty-third NAND circuit ND23, a twenty-fourth NAND circuit ND24 and a twenty-fifth NAND circuit ND25. For example, the twenty-third NAND circuit ND23 may perform a NAND operation on a complementary signal BA12B of the one-two bank signal BA12 and the first repair mode signal MODE1 and output a third repair decision signal BM3. The twenty-fourth NAND circuit ND24 may perform a NAND operation on the second bank signal BA2 and the second repair mode signal MODE2 and output a fourth repair decision signal BM4. The twenty-fifth NAND circuit ND25 may perform a NAND operation on the third repair decision signal BM3 and the fourth repair decision signal BM4 and output a second bank spare wordline driving signal SNWEI_B2.

As another example, the second repair wordline selection circuit 132 may jointly use the eleventh NAND circuit ND11, the twelfth NAND circuit ND12 and the first NOR circuit NR1 of the first repair wordline selection circuit 131 instead of the twenty-first NAND circuit ND21, the twenty-second NAND circuit ND22, and the second NOR circuit NR2. The twenty-first NAND circuit ND21 may calculate the same output signal as the eleventh NAND circuit ND11 based on the same input signals. The twenty-second NAND circuit ND22 may calculate the same output signal as the twelfth NAND circuit ND12 based on the same input signals. The second NOR circuit NR2 may calculate the same output signal as the first NOR circuit NR1 based on the same input signals.

Figure 10:
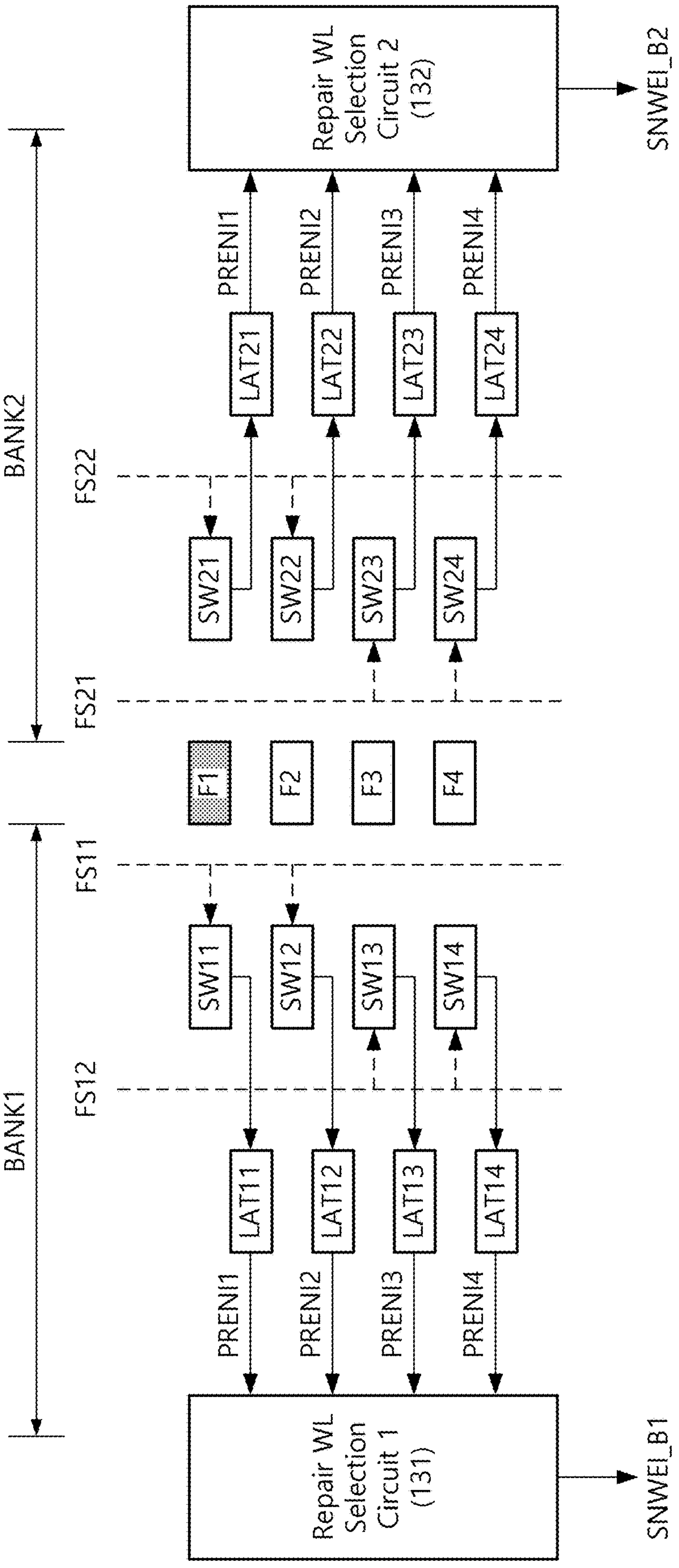
FIG. 10 is a diagram illustrating the operation of latches and switches of FIG. 6 in a first repair mode.
Figure 11:
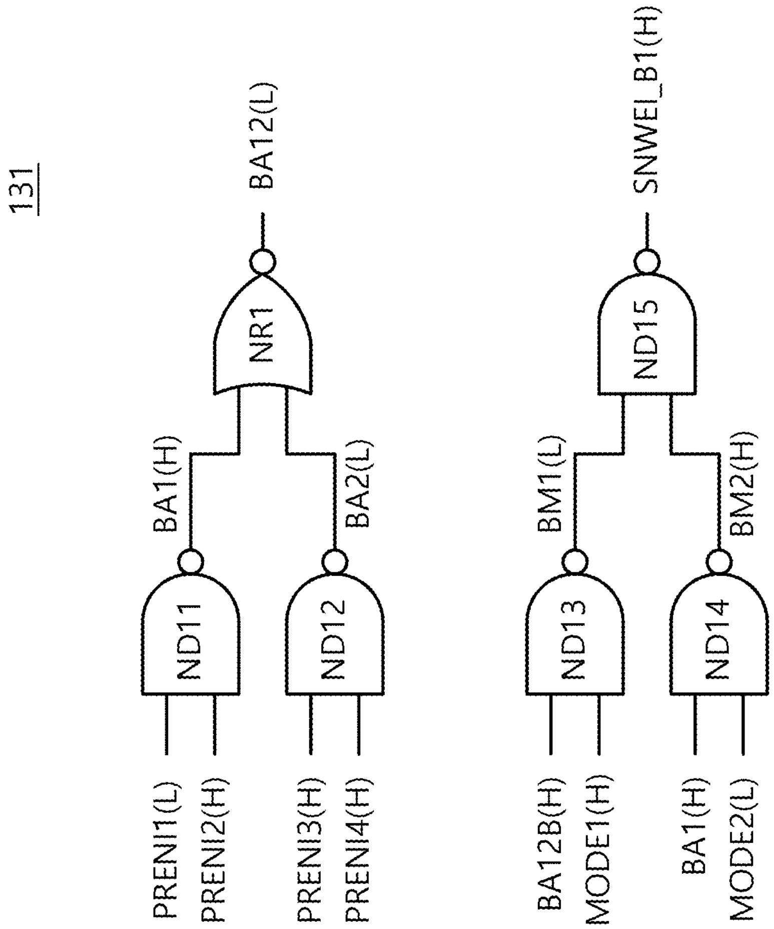
FIG. 11 is a diagram illustrating the operation of logic circuits of FIG. 8 in a first repair mode.
Figure 12:
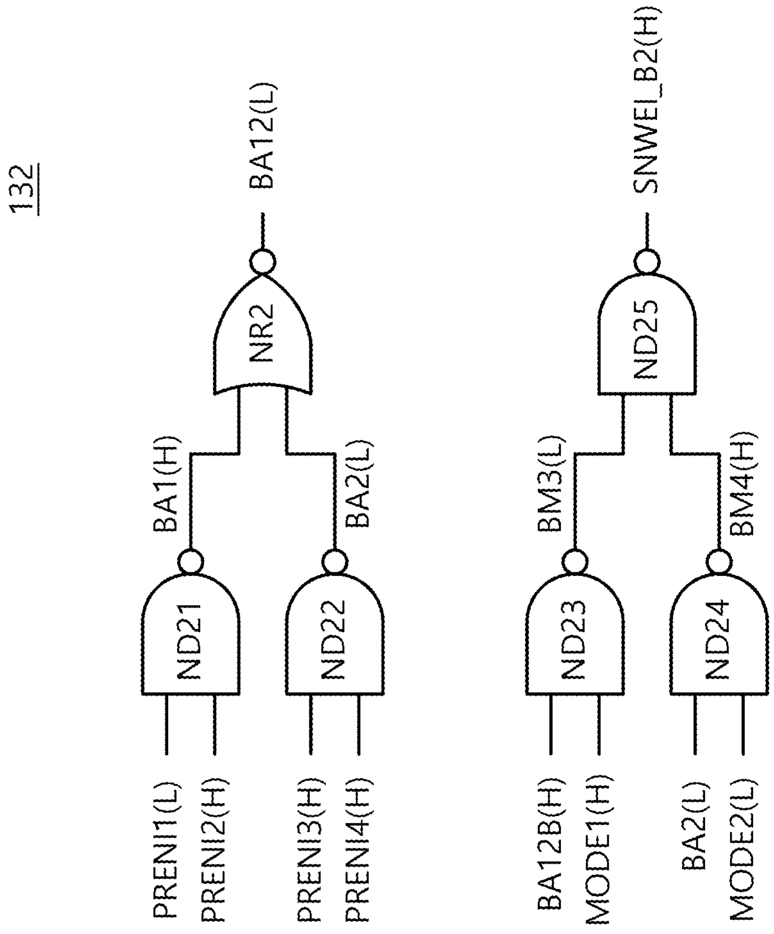
FIG. 12 is a diagram illustrating the operation of logic circuits of FIG. 9 in a first repair mode.

FIGS. 10 to 12 are diagrams illustrating an operation of a repair control circuit of FIG. 5 in a first repair mode. FIG. 10 is a diagram illustrating the operation of latches and switches of FIG. 6 in a first repair mode. FIG. 11 is a diagram illustrating the operation of logic circuits of FIG. 8 in a first repair mode. FIG. 12 is a diagram illustrating the operation of logic circuits of FIG. 9 in a first repair mode. FIGS. 10 to 12 illustrate the first repair wordline selection circuit 131 and the second repair wordline selection circuit 132 as examples, but the remaining repair wordline selection circuits may also operate the same as the first repair wordline selection circuit 131 and the second repair wordline selection circuit 132.

Referring to FIGS. 10 to 12, when a failed memory cell is located in the first wordline group WG11 of the first memory bank BANK1 corresponding to the first repair fuse F1, the first repair fuse F1 may store changed first redundancy enable information PRENI1. For example, one repair fuse may store a high level (logic 1) when the corresponding wordline group is normal, and store a low level (logic 0) when the corresponding wordline group includes a failed memory cell.

According to an example embodiment, in the first repair mode, the eleventh fuse selection signal FS11, the twelfth fuse selection signal FS12, the twenty-first fuse selection signal FS21 and the twenty-second fuse selection signal FS22 may be all activated. When the eleventh fuse selection signal FS11, the twelfth fuse selection signal FS12, the twenty-first fuse selection signal FS21 and the twenty-second fuse selection signal FS22 are all activated, all switches may be turned on, and the first redundancy enable information PRENI1 to the fourth redundancy enable information PRENI4 may be transmitted to both the first repair wordline selection circuit 131 and the second repair wordline selection circuit 132. As an example, when a failed memory cell is located in the eleventh wordline group WG11 of the first memory bank BANK1, the first redundancy enable information PRENI1 may have a low level, and the second to fourth redundancy enable information PRENI2, PRENI3 and PRENI4 may have a high level.

According to an example embodiment, in FIG. 11, when at least one of the first to fourth redundancy enable information PRENI1, PRENI2, PRENI3 and PRENI4 is a low level, the one-two bank signal BA12 may have a low level. As an example, since the first redundancy enable information PRENI1 is at a low level, the first bank signal BA1 is at a high level. Since the third redundancy enable information PRENI3 and the fourth redundancy enable information PRENI4 are both at a high level, the second bank signal BA2 is at a low level. Accordingly, the one-two bank signal BA12 is at a low level.

According to an example embodiment, the first repair wordline selection circuit 131 (or repair control circuit 130) may receive the repair mode signal MODE from the mode selection circuit 110 of FIG. 5. For example, the repair mode signal MODE may include the first repair mode signal MODE1 and the second repair mode signal MODE2. The first repair mode signal MODE1 and the second repair mode signal MODE2 may be complementary signals. In the first repair mode, the first repair mode signal MODE1 may be activated and the second repair mode signal MODE2 may be deactivated.

According to an example embodiment, in the first repair mode, as the first repair mode signal MODE1 is at a high level, the first repair decision signal BM1 may be determined according to the complementary signal BA12B of the one-two bank signal BA12. In FIG. 11, since a failed memory cell is located in the eleventh wordline group WG11 and the complementary signal BA12B of the one-two bank signal BA12 is at a high level, the first repair decision signal BM1 is at a low level. Since the second repair mode signal MODE2 is at a low level, the second repair decision signal BM2 is at a high level.

Accordingly, the first bank spare wordline driving signal SNWEI_B1 may have a high level. For example, when the first bank spare wordline driving signal SNWEI_B1 is at a high level, the eleventh wordline group WG11 may be repaired. When the first bank spare wordline driving signal SNWEI_B1 is at a low level, the eleventh wordline group WG11 may not be repaired.

According to an example embodiment, in FIG. 12, when at least one of the first to fourth redundancy enable information PRENI1, PRENI2, PRENI3 and PRENI4 is at a low level, the one-two bank signal BA12 may have a low level. As an example, since the first redundancy enable information PRENI1 is at a low level, the first bank signal BA1 is at a high level. Since the third redundancy enable information PRENI3 and the fourth redundancy enable information PRENI4 are both at a high level, the second bank signal BA2 is at a low level. Accordingly, the one-two bank signal BA12 is at a low level.

According to an example embodiment, in the first repair mode, as the first repair mode signal MODE1 is at a high level, the third repair decision signal BM3 may be determined according to the complementary signal BA12B of the one-two bank signal BA12. In FIG. 12, since a failed memory cell is located in the eleventh wordline group WG11 and the complementary signal BA12B of the one-two bank signal BA12 is at a high level, the third repair decision signal BM3 is at a low level. Since the second repair mode signal MODE2 is at a low level, the fourth repair decision signal BM4 is at a high level.

Accordingly, the second bank spare wordline driving signal SNWEI_B2 may have a high level. As an example, when the second bank spare wordline driving signal SNWEI_B2 is at a high level, the twenty-first wordline group WG21 may be repaired. When the second bank spare wordline driving signal SNWEI_B2 is at a low level, the twenty-first wordline group WG21 may not be repaired.

Therefore, in the first repair mode, when a failed memory cell is located in the eleventh wordline group WG11 of the first memory bank BANK1, the eleventh wordline group WG11 and the twenty-first wordline group WG21 may be repaired together.

Figure 13:
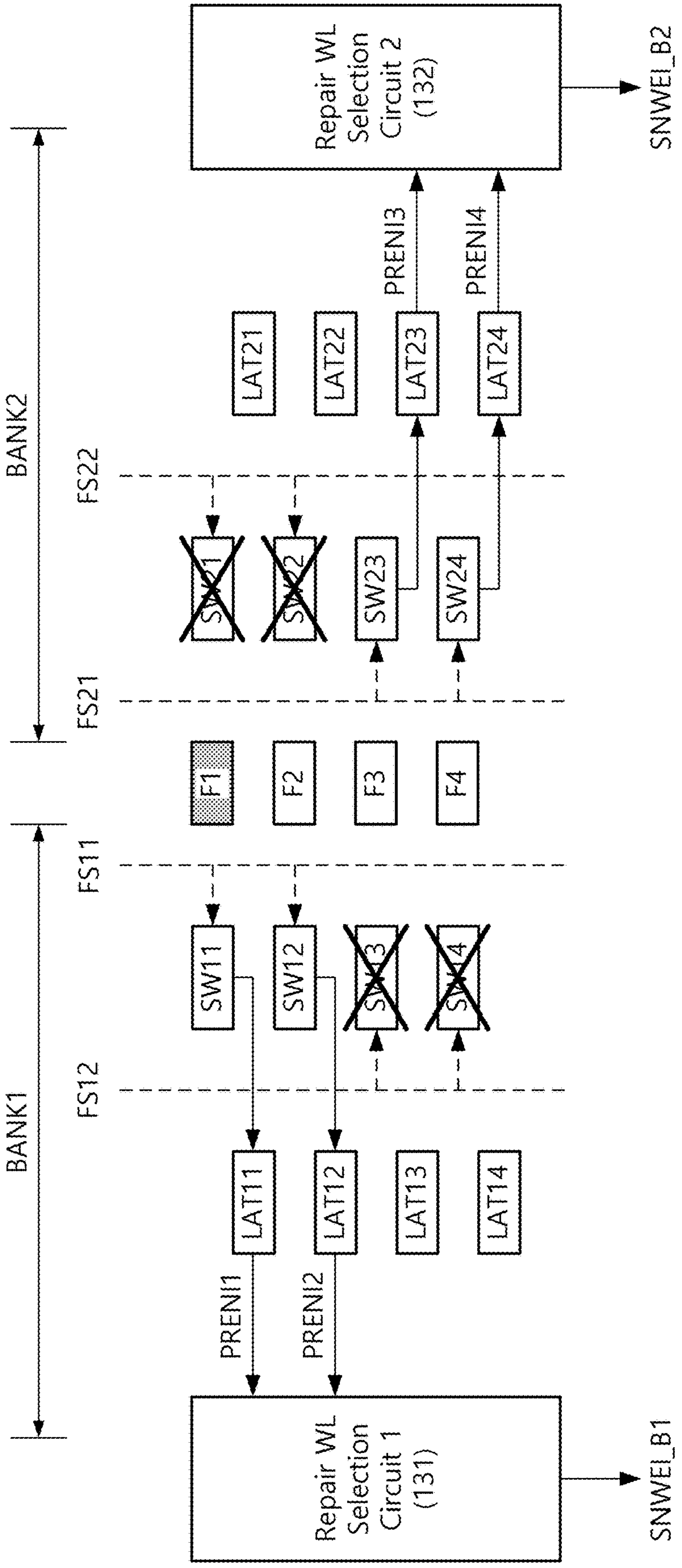
FIG. 13 is a diagram illustrating the operation of latches and switches of FIG. 6 in a second repair mode.
Figure 14:
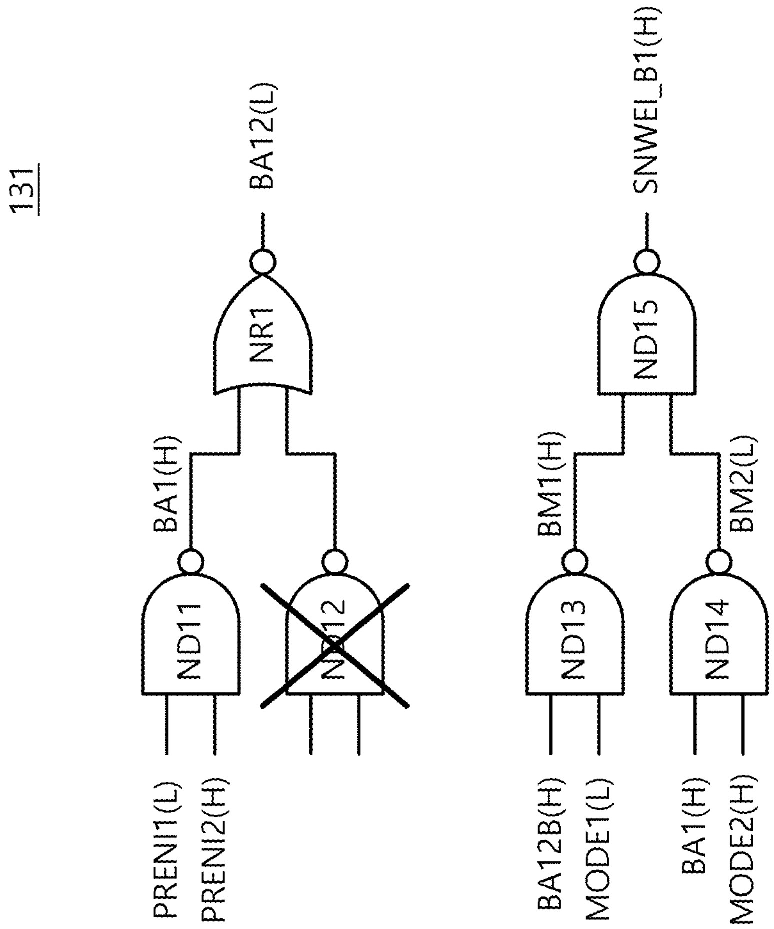
FIG. 14 is a diagram illustrating the operation of logic circuits of FIG. 8 in a second repair mode.
Figure 15:
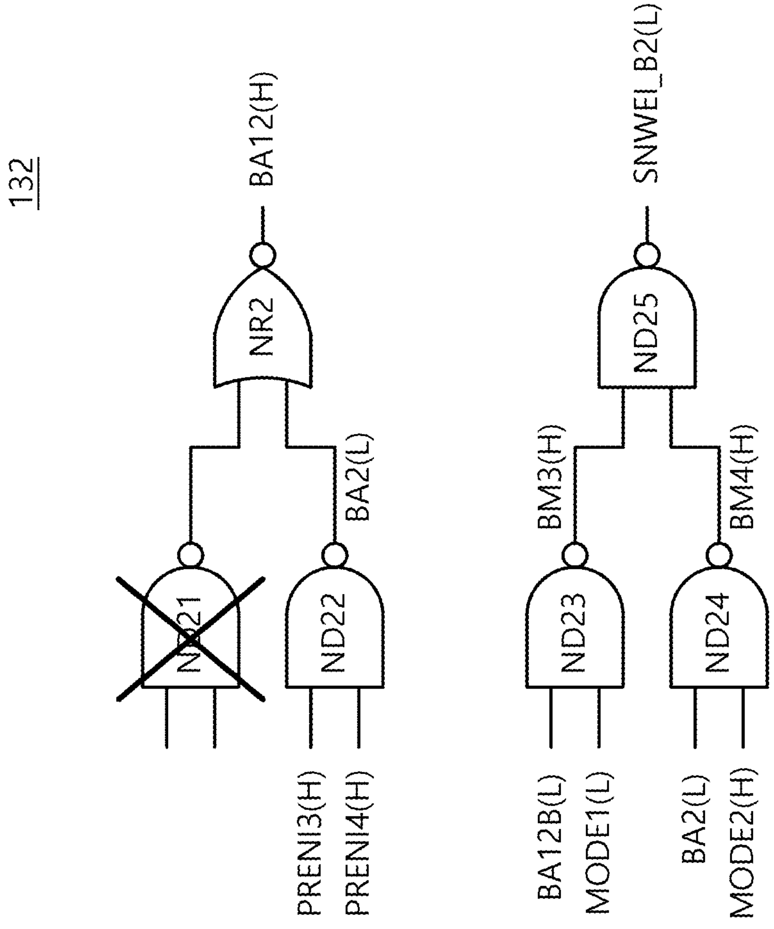
FIG. 15 is a diagram illustrating the operation of logic circuits of FIG. 9 in a second repair mode.

FIGS. 13 to 15 are diagrams illustrating an operation of the repair control circuit of FIG. 5 in the second repair mode. FIG. 13 is a diagram illustrating the operation of latches and switches of FIG. 6 in a second repair mode. FIG. 14 is a diagram illustrating the operation of logic circuits of FIG. 8 in a second repair mode. FIG. 15 is a diagram illustrating the operation of logic circuits of FIG. 9 in a second repair mode. FIGS. 13 to 15 illustrate the first repair wordline selection circuit 131 and the second repair wordline selection circuit 132 as examples, but the remaining repair wordline selection circuits also operate the same as the first repair wordline selection circuit 131 and the second repair wordline selection circuit 132.

Referring to FIGS. 13 to 15, when a failed memory cell is located in the first wordline group WG11 of the first memory bank BANK1 corresponding to the first repair fuse F1, the first repair fuse F1 may store changed first redundancy enable information PRENI1. For example, one repair fuse may store a high level (logic 1) when the corresponding wordline group is normal, and store a low level (logic 0) when the corresponding wordline group includes a failed memory cell.

According to an example embodiment, in the second repair mode, the eleventh fuse selection signal FS11 and the twenty-first fuse selection signal FS21 may be activated. The twelfth fuse selection signal FS12 and the twenty-second fuse selection signal FS22 may be deactivated. Accordingly, the eleventh switch SW11, the twelfth switch SW12, the twenty-third switch SW23 and the twenty-fourth switch SW24 are turned on. The thirteenth switch SW13, the fourteenth switch SW14, the twenty-first switch SW21 and the twenty-second switch SW22 may be turned off.

According to an example embodiment, according to the turning on or turning off of the switches, the first redundancy enable information PRENI1 and the second redundancy enable information PRENI2 may be transmitted to the first repair wordline selection circuit 131. In addition, the third redundancy enable information PRENI3 and the fourth redundancy enable information PRENI4 may be transmitted to the second repair wordline selection circuit 132.

As an example, when a failed memory cell is located in the eleventh wordline group WG11 of the first memory bank BANK1, the first redundancy enable information PRENI1 may be at a low level, and the second to fourth redundancy enable information PRENI2, PRENI3 and PRENI4 may have a high level.

According to an example embodiment, in FIG. 14, as the first repair wordline selection circuit 131 receives only the first redundancy enable information PRENI1 and the second redundancy enable information PRENI2, the one-two bank signal BA12 may be determined by the first redundancy enable information PRENI1 and the second redundancy enable information PRENI2. As an example, since the first redundancy enable information PRENI1 is at a low level, the first bank signal BA1 is at a high level. Since the first bank signal BA1 is at a high level, the one-two bank signal BA12 is at a low level.

According to an example embodiment, the first repair wordline selection circuit 131 (or repair control circuit 130) may receive the repair mode signal MODE from the mode selection circuit 110 of FIG. 5. For example, the repair mode signal MODE may include the first repair mode signal MODE1 and the second repair mode signal MODE2. The first repair mode signal MODE1 and the second repair mode signal MODE2 may be complementary signals. In the second repair mode, the first repair mode signal MODE1 may be deactivated and the second repair mode signal MODE2 may be activated.

According to an example embodiment, in the second repair mode, as the first repair mode signal MODE1 is at a low level, the first repair decision signal BM1 may be at a high level. Since the second repair mode signal MODE2 is at a high level, the second repair decision signal BM2 may be determined according to the first bank signal BA1. In FIG. 14, since a failed memory cell is located in the eleventh wordline group WG11 and the first bank signal BA1 is at a high level, the second repair decision signal BM2 is at a low level.

Accordingly, the first bank spare wordline driving signal SNWEI_B1 may have a high level. As an example, when the first bank spare wordline driving signal SNWEI_B1 is at a high level, the eleventh wordline group WG11 may be repaired. When the first bank spare wordline driving signal SNWEI_B1 is at a low level, the eleventh wordline group WG11 may not be repaired.

According to an example embodiment, in FIG. 15, as the second repair wordline selection circuit 132 receives only the third redundancy enable information PRENI3 and the fourth redundancy enable information PRENI4, the one-two bank signal BA12 may be determined by the third redundancy enable information PRENI3 and the fourth redundancy enable information PRENI4. For example, since the third redundancy enable information PRENI3 and the fourth redundancy enable information PRENI4 are both at a high level, the second bank signal BA2 is at a low level. Since the second bank signal BA2 is at a low level, the one-two bank signal BA12 is at a high level.

According to an example embodiment, in the second repair mode, as the first repair mode signal MODE1 is at a low level, the third repair decision signal BM3 is at a high level. Since the second repair mode signal MODE2 is at a high level, the fourth repair decision signal BM4 may be determined according to the second bank signal BA2. In FIG. 15, since there are no failed memory cells in the twenty-first wordline group WG21, the second bank signal BA2 is at a low level, and therefore the fourth repair decision signal BM4 is at a high level.

According to an example embodiment, since the third repair decision signal BM3 and the fourth repair decision signal BM4 are both at a high level, the second bank spare wordline driving signal SNWEI_B2 may have a low level. As an example, when the second bank spare wordline driving signal SNWEI_B2 is at a high level, the twenty-first wordline group WG21 may be repaired. When the second bank spare wordline driving signal SNWEI_B2 is at a low level, the twenty-first wordline group WG21 may not be repaired.

Therefore, in the second repair mode, when a failed memory cell is located in the eleventh wordline group WG11 of the first memory bank BANK1, the eleventh wordline group WG11 is repaired, and the twenty-first wordline group WG21 may not be repaired. That is, in the second repair mode, the first memory bank BANK1 and the second memory bank BANK2 may be repaired separately.

Figure 16:
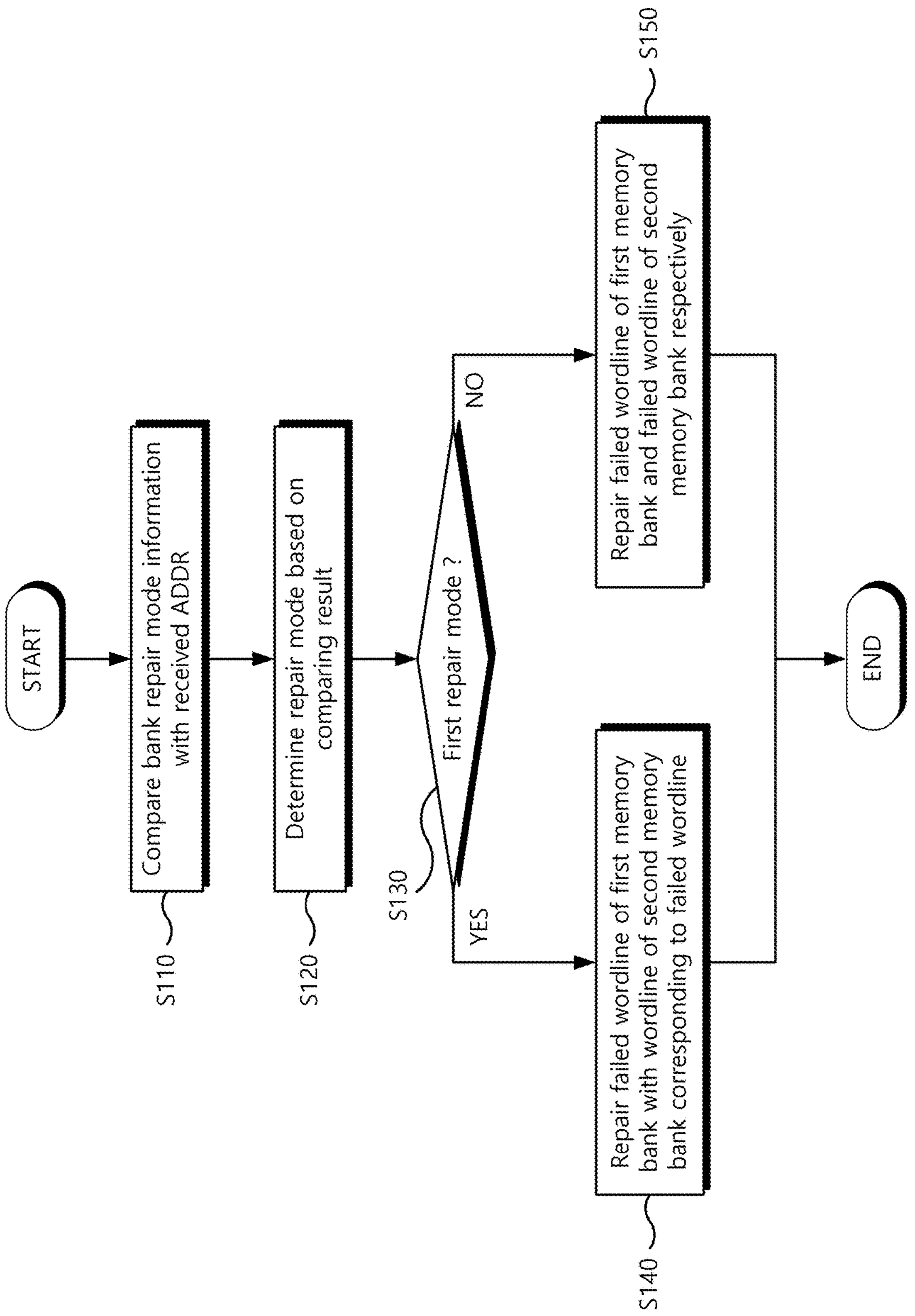
FIG. 16 is a flowchart illustrating a repair method for a memory device of FIG. 2.

FIG. 16 is a flowchart illustrating a repair method for a memory device of FIG. 2. Referring to FIGS. 2 to 16, the memory device 1200 may determine a repair mode for failed memory cells included in the memory cell array 1210 based on an address ADDR received from the memory controller 1100.

According to an example embodiment, in operation S110, the memory device 1200 may compare the bank repair mode information BRMI with the address ADDR received from the memory controller 1100. For example, the address buffer 1220 may receive the address ADDR and output a row address RA and a column address CA. The repair circuit 100 may store bank repair mode information BRMI including information indicating a repair mode of each memory bank based on location information of the failed memory cells.

According to an example embodiment, in operation S120, the memory device 1200 may determine a repair mode based on the comparison result in operation S110. For example, the repair circuit 100 may compare the bank repair mode information BRMI and the row address RA.

As an example, the mode information register 120 may store the bank repair mode information BRMI. The mode selection circuit 110 may check a repair mode of a currently activated memory bank based on the row address RA and the bank repair mode information BRMI. The mode selection circuit 110 may generate a repair fuse selection signal FS and a repair mode signal MODE based on the row address RA and the bank repair mode information BRMI.

According to an example embodiment, in operation S130, the memory device 1200 may check whether the determined repair mode is the first repair mode. When the determined repair mode is the first repair mode (YES in FIG. 16), the memory device 1200 may perform operation S140. When the determined repair mode is the second repair mode (NO in FIG. 16), the memory device 1200 may perform operation S150.

According to an example embodiment, in operation S140, the memory device 1200 may repair failed wordlines including the failed memory cells in the first memory bank and the second memory bank together with corresponding wordlines. For example, in the first repair mode, the redundancy enable information PRENI1 to PRENI8 stored in the plurality of repair fuses F1 to F8 may all be transmitted to a repair wordline selection circuit corresponding to the first memory bank BANK1 (for example, the first repair wordline selection circuit 131 or the third repair wordline selection circuit 133) and a repair wordline selection circuit corresponding to the second memory bank BANK2 (for example, the second repair wordline selection circuit 132 or the fourth repair wordline selection circuit 134). Accordingly, the eleventh wordline group WG11 of the first memory bank BANK1 and the twenty-first wordline group WG21 of the second memory bank BANK2, which corresponds to the eleventh wordline group WG11, may be repaired together.

According to an example embodiment, in operation S150, the memory device 1200 may separately repair a failed wordline of the first memory bank BANK1 and a failed wordline of the second memory bank BANK2. For example, in the second repair mode, some of the redundancy enable information PRENI1 to PRENI8 stored in the plurality of repair fuses F1 to F8 may be transmitted to a repair wordline selection circuit corresponding to the first memory bank BANK1 (for example, the first repair wordline selection circuit 131 or the third repair wordline selection circuit 133). Other portions of the redundancy enable information PRENI1 to PRENI8 stored in the plurality of repair fuses F1 to F8 may be transmitted to a repair wordline selection circuit corresponding to the second memory bank BANK2 (for example, the second repair wordline selection circuit 132 or the fourth repair wordline selection circuit 134). Accordingly, the failed wordlines of the first memory bank BANK1 may be repaired separately from the failed wordlines of the second memory bank BANK2.

Figure 17:
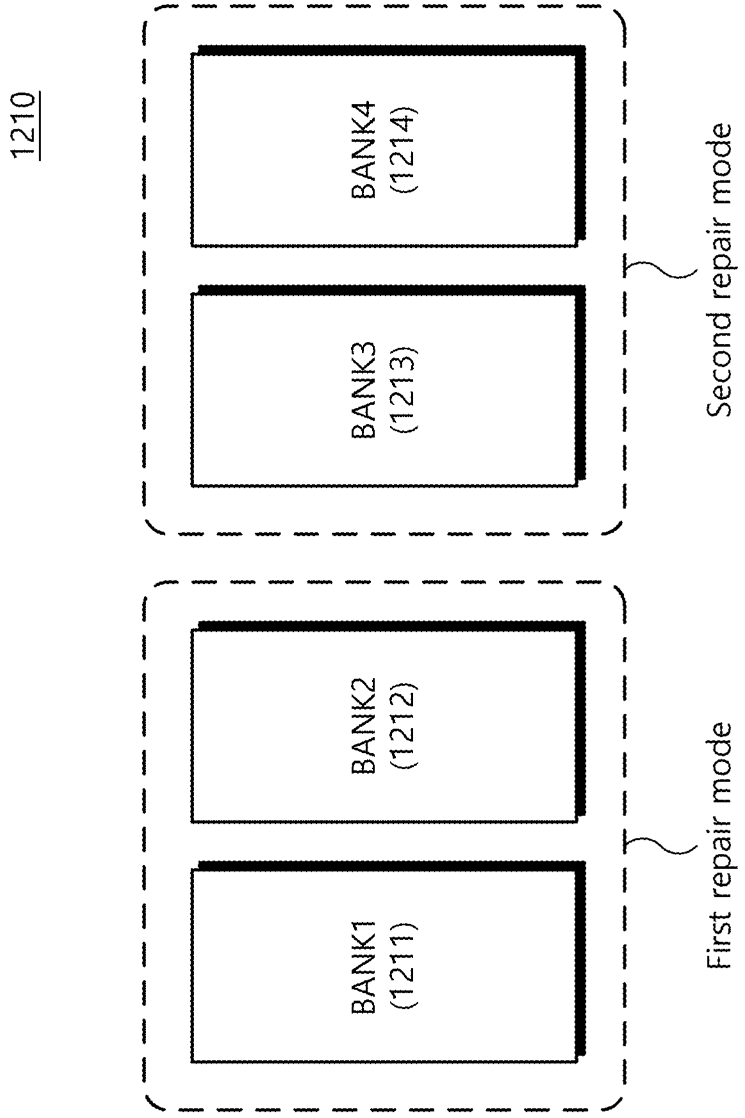
FIG. 17 is a diagram illustrating a repair method for memory banks included in a memory cell array of FIG. 2.

FIG. 17 is a diagram illustrating a repair method for memory banks included in a memory cell array of FIG. 2. Referring to FIG. 17, the memory cell array 1210 may include a plurality of memory banks. The plurality of memory banks may be set to different repair modes depending on distribution locations of failed memory cells.

As an example, the plurality of memory banks may include first to fourth memory banks 1211, 1212, 1213 and 1214. The first memory bank 1211 may correspond to the second memory bank 1212, and the first memory bank 1211 and the second memory bank 1212 may share the same first repair fuses. The third memory bank 1213 may correspond to the fourth memory bank 1214, and the third memory bank 1213 and the fourth memory bank 1214 may share the same second repair fuses.

When failed memory cells are symmetrically distributed in the first memory bank 1211 and the second memory bank 1212, failed wordlines of the first memory bank 1211 and the second memory bank 1212 may be repaired in the first repair mode. In addition, when failed memory cells are concentrated in any one of the third memory bank 1213 and the fourth memory bank 1214, failed wordlines of the third memory bank 1213 and the fourth memory bank 1214 may be repaired in the second repair mode. That is, the first bank pair (the first memory bank 1211 and the second memory bank 1212) and the second bank pair (the third memory bank 1213 and the fourth memory bank 1214) may be set to either the first repair mode or second repair mode independently of each other.

According to the present disclosure, it may be possible to efficiently use repair resources by changing repair modes of the memory banks according to the distribution location of failed memory cells.

While the present disclosure has been described with reference to embodiments thereof, it will be apparent to those of ordinary skill in the art that various changes and modifications may be made thereto without departing from the spirit and scope of the present disclosure as set forth in the following claims.

What is claimed is:

1. A memory device comprising:

a first memory bank including first memory cells connected to a first wordline;

a second memory bank including second memory cells connected to a second wordline sharing a repair fuse with the first wordline; and a repair circuit configured to generate at least one fuse selection signal and a repair mode signal based on a row address and bank repair mode information according to positions of failed memory cells, and combine the at least one fuse selection signal and the repair mode signal to selectively operate in a first repair mode and in a second repair mode based on distribution of the failed memory cells in the first wordline and the second wordline by selectively outputting redundancy enable information stored in the repair fuse;

wherein in the first repair mode the repair circuit is configured to repair the first wordline and the second wordline together, and wherein in the second repair mode the repair circuit is configured to repair the first wordline or the second wordline individually.

2. The memory device of claim 1, wherein the repair circuit comprises:

a mode information register configured to store the bank repair mode information according to the positions of the failed memory cells, the bank repair mode information indicating whether a corresponding memory bank is to be repaired in the first repair mode or the second repair mode;

a mode selection circuit configured to generate the at least one fuse selection signal and the repair mode signal based on the row address included in an address received from an external device and the bank repair mode information; and a repair control circuit configured to generate a spare wordline driving signal based on the at least one fuse selection signal and the repair mode signal.

3. The memory device of claim 2, further comprising:

a row decoder configured to activate a selected wordline corresponding to the row address in the first memory bank or the second memory bank, wherein the row decoder is configured to replace the selected wordline with a redundancy wordline based on the spare wordline driving signal.

4. The memory device of claim 2, wherein the repair control circuit comprises:

a first repair wordline selection circuit configured to generate a first bank spare wordline driving signal corresponding to the first wordline based on the redundancy enable information;

a second repair wordline selection circuit configured to generate a second bank spare wordline driving signal corresponding to the second wordline based on the redundancy enable information;

first latches configured to transmit the redundancy enable information to the first repair wordline selection circuit based on first fuse selection signals; and second latches configured to transmit the redundancy enable information to the second repair wordline selection circuit based on second fuse selection signals, wherein the first repair wordline selection circuit and the second repair wordline selection circuit are configured to perform logical operations on the redundancy enable information and the repair mode signal to generate the first bank spare wordline driving signal and the second bank spare wordline driving signal.

5. The memory device of claim 4, wherein, in the first repair mode, the repair circuit is configured to repair the first wordline and the second wordline together based on the bank repair mode information, all of the first latches are configured to be turned on by the first fuse selection signals, and all of the second latches are configured to be turned on by the second fuse selection signals.

6. The memory device of claim 5, wherein the first repair wordline selection circuit is configured to perform a logical operation on the redundancy enable information transmitted through the first latches to output the first bank spare wordline driving signal repairing the first wordline, wherein the second repair wordline selection circuit is configured to perform a logical operation on the redundancy enable information transmitted through the second latches to output the second bank spare wordline driving signal repairing the second wordline.

7. The memory device of claim 4, wherein in the second repair mode, the repair circuit is configured to individually repair the first wordline or the second wordline based on the bank repair mode information, only a portion of the first latches is configured to be turned on by the first fuse selection signals, and only a portion of the second latches is configured to be turned on by the second fuse selection signals.

8. The memory device of claim 7, wherein the first repair wordline selection circuit is configured to perform a logical operation on a portion of the redundancy enable information transmitted through a portion of the first latches to output the first bank spare wordline driving signal repairing the first wordline when a failed memory cell is located in the first wordline.

9. The memory device of claim 8, wherein the second repair wordline selection circuit is configured to perform a logical operation on another portion of the redundancy enable information transmitted through a portion of the second latches to output the second bank spare wordline driving signal repairing the second wordline when a failed memory cell is located in the second wordline.

10. The memory device of claim 1, wherein the repair circuit is configured to determine whether to operate in the first repair mode or the second repair mode at run time in response to the row address selecting the first wordline or the second wordline, wherein the determination is based on comparing the bank repair mode information, generated from distribution of the failed memory cells, with the row address.

11. A memory device comprising:

a first memory bank including a first wordline group;

a second memory bank including a second wordline group sharing repair fuses with the first wordline group;

a row decoder configured to select wordlines of the first memory bank and the second memory bank based on a row address received from an external device; and a repair circuit configured to provide a spare wordline driving signal to the row decoder based on bank repair mode information corresponding to the first wordline group or the second wordline group, in response to the first wordline group or the second wordline group being selected based on the row address, wherein based on the bank repair mode information, the repair circuit is configured to:

generate at least one fuse selection signal and a repair mode signal based on the row address and the bank repair mode information according to positions of failed memory cells, combine the at least one fuse selection signal and the repair mode signal to selectively operate in a first repair mode and in a second repair mode based on distribution of the failed memory cells in the first wordline group and in the second wordline group by selectively outputting redundancy enable information stored in the repair fuses, generate the spare wordline driving signal based on the redundancy enable information, provide a first bank spare wordline driving signal of the spare wordline driving signal in the first repair mode so that the first wordline group and the second wordline group are repaired together, and provide a second bank spare wordline driving signal of the spare wordline driving signal in the second repair mode so that the first wordline group or the second wordline group are repaired individually.

12. The memory device of claim 11, wherein the repair circuit comprises:

a mode information register configured to store the bank repair mode information including location information of the failed memory cells;

a mode selection circuit configured to generate the at least one fuse selection signal and the repair mode signal based on the row address and the bank repair mode information; and a repair control circuit configured to generate the spare wordline driving signal based on the at least one fuse selection signal and the repair mode signal.

13. The memory device of claim 11, wherein the repair circuit comprises:

a first repair wordline selection circuit configured to generate the first bank spare wordline driving signal corresponding to the first wordline group based on the redundancy enable information;

a second repair wordline selection circuit configured to generate the second bank spare wordline driving signal corresponding to the second wordline group based on the redundancy enable information;

first latches configured to transmit the redundancy enable information to the first repair wordline selection circuit based on first fuse selection signals; and second latches configured to transmit the redundancy enable information to the second repair wordline selection circuit based on second fuse selection signals.

14. The memory device of claim 11, further comprising:

a third memory bank including a third wordline group; and a fourth memory bank including a fourth wordline group sharing another set of repair fuses with the third wordline group, wherein the first memory bank and the second memory bank are configured to be set to the first repair mode to repair the first wordline group and the second wordline group together, and wherein the third memory bank and the fourth memory bank are configured to be set to the second repair mode to individually repair the third wordline group or the fourth wordline group.

15. A repair method of a memory device comprising:

generating a fuse selection signal and a repair mode signal based on a row address and bank repair mode information according to positions of failed memory cells in a first memory bank and a second memory bank sharing repair fuses with the first memory bank;

combining the fuse selection signal and the repair mode signal to selectively operate in a first repair mode and in a second repair mode based on distribution of the failed memory cells in the first memory bank and the second memory bank;

determining a repair mode of the first memory bank based on a result of combining the fuse selection signal and the repair mode signal;

repairing, in a first repair operation, a failed wordline included in the first memory bank and a wordline sharing at least one of the repair fuses with the failed wordline in the second memory bank together when the repair mode is determined to be the first repair mode; and individually repairing, in a second repair operation, the failed wordline included in the first memory bank and a failed wordline included in the second memory bank when the repair mode is determined to be the second repair mode.

16. The method of claim 15, wherein the bank repair mode information is configured to be set to indicate the first repair mode when the failed memory cells are distributed in both the first memory bank and the second memory bank.

17. The method of claim 15, wherein the bank repair mode information is configured to be set to indicate the second repair mode when the failed memory cells are concentrated in one of the first memory bank or the second memory bank.

18. The method of claim 15, wherein, in the first repair operation, the fuse selection signal is configured to be set so that redundancy enable information is equally transmitted to a first repair wordline selection circuit corresponding to the first memory bank and a second repair wordline selection circuit corresponding to the second memory bank, and wherein the repair mode signal is configured to be set as a first repair mode signal.

19. The method of claim 18, wherein, in the second repair operation, the fuse selection signal is configured to be set so that a portion of the redundancy enable information is transmitted to the first repair wordline selection circuit corresponding to the first memory bank, and another portion of the redundancy enable information is transmitted to the second repair wordline selection circuit corresponding to the second memory bank, and wherein the repair mode signal is configured to be set as a second repair mode signal.

* * * * *